(12) United States Patent  
Kasai et al.

(10) Patent No.: US 9,167,352 B2  
(45) Date of Patent: Oct. 20, 2015

(54) MICROPHONE

(71) Applicant: OMRON Corporation, Kyoto-shi, Kyoto (JP)

(72) Inventors: Masaaki Kasai, Shiga (JP); Hidetoshi Nishio, Osaka (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/224,406

(22) Filed: Mar. 25, 2014

(65) Prior Publication Data

US 2014/0291785 A1 Oct. 2, 2014

(30) Foreign Application Priority Data

Mar. 26, 2013 (JP) .................. 2013-063283

(51) Int. Cl.
*H04R 19/00* (2006.01)
*B81B 7/00* (2006.01)
*H04R 1/08* (2006.01)
*H04R 31/00* (2006.01)

(52) U.S. Cl.
CPC ............ *H04R 19/005* (2013.01); *B81B 7/0061* (2013.01); *B81B 2201/0257* (2013.01); *B81B 2207/012* (2013.01); *B81B 2207/096* (2013.01); *B81C 2203/0154* (2013.01); *H04R 1/083* (2013.01); *H04R 31/006* (2013.01)

(58) Field of Classification Search
CPC .... B82B 7/0061; B81B 7/0061; B81B 7/008; B81B 2207/096; B81B 2201/0257; B81B 2207/012; H04R 19/005; H04R 1/083; H04R 31/006; B81C 2203/0154
USPC ........................................................ 257/419
See application file for complete search history.

(56) References Cited

U.S. PATENT DOCUMENTS

| 7,763,972 B2 | 7/2010 | Chien et al. |
| 8,433,084 B2 * | 4/2013 | Conti et al. .................. 381/174 |
| 2007/0278601 A1 | 12/2007 | Goodelle et al. |
| 2014/0306299 A1 * | 10/2014 | Kasai ........................... 257/416 |

* cited by examiner

*Primary Examiner* — William Coleman
(74) *Attorney, Agent, or Firm* — Osha Liang LLP

(57) ABSTRACT

A microphone has a base substrate having a main surface, an acoustic sensor mounted on the main surface, and a circuit element that processes a signal output from the acoustic sensor. The acoustic sensor has a sensor substrate having a first surface opposed to the base substrate, a second surface on a side opposite to the first surface, and a cavity formed while piercing the sensor substrate from the first surface to the second surface, and a movable electrode that covers the cavity from the second surface side. A through-hole is formed in the base substrate while piercing the base substrate in a thickness direction to communicate with the cavity. The through-hole overlaps the sensor substrate when viewed in the thickness direction of the base substrate.

18 Claims, 10 Drawing Sheets

MICROPHONE

BACKGROUND

1. Field

The present invention relates to a microphone, particularly to a microphone in which an acoustic sensor is mounted on a main surface of a base substrate.

2. Related Art

A microphone is used in various devices such as a mobile phone and an digital voice recorder. For example, in the microphone disclosed in U.S. Pat. No. 7,763,972, an acoustic sensor and a circuit element are stacked, the acoustic sensor includes a thin film acting as a sensor unit, and the circuit element includes a cavity formed at a position corresponding to the thin film.

Nowadays, there is a demand for further downsizing in the microphone, particularly there is a demand for a low profile in which a whole height of the microphone is reduced. A distance between a sound hole communicating with an outside of the microphone and the sensor unit decreases when the height is reduced for the purpose of the low profile as disclosed in U.S. Pat. No. 7,763,972. Therefore, unfortunately an acoustic characteristic of the microphone is degraded due to a foreign matter invading into the microphone through the sound hole, and the sensor unit is easily broken due to compressed air flowing into the microphone through the sound hole.

U.S. Patent Application Publication No. 2007/0278601 discloses a device having a configuration in which external interference is prevented by bending an acoustic port in a substrate.

In the device disclosed in U.S. Patent Application Publication No. 2007/0278601, the substrate is required to have a thickness for forming the acoustic port having the best shape inside the substrate. Therefore, there is a limitation to the reduction of the substrate thickness, which results in the low profile of the whole microphone being difficult to achieve.

SUMMARY

One or more embodiments of the present invention achieves a low-profile microphone while a thin-film diaphragm is protected from the external environment.

In accordance with one or more embodiments of the present invention, a microphone includes a base substrate including a main surface, an acoustic sensor mounted on the main surface, and a circuit element configured to process a signal output from the acoustic sensor. The acoustic sensor includes a sensor substrate and a movable electrode. The sensor substrate includes a first surface opposed to the base substrate and a second surface on a side opposite to the first surface. A cavity is formed in the sensor substrate while piercing the sensor substrate from the first surface to the second surface. The movable electrode is configured to cover the cavity from the second surface side. A through-hole is made in the base substrate while piercing the base substrate in a thickness direction to communicate with the cavity. The through-hole overlaps the sensor substrate when viewed in the thickness direction of the base substrate.

According to one or more embodiments of the present invention, the microphone further includes an adhesive layer. The adhesive layer is interposed between the main surface and the first surface to cause the sensor substrate to adhere to the base substrate. In the microphone, a hollow region where the adhesive layer is not provided is formed between the main surface and the first surface. The through-hole communicates with the cavity through the hollow region.

According to one or more embodiments of the present invention, a recess in which at least one of the main surface and the first surface is recessed is formed, and the through-hole communicates with the cavity through the recess. An adhesive cured material in which a liquid adhesive is cured may be accommodated in part of the recess.

According to one or more embodiments of the present invention, the base substrate includes a projection projected from the main surface, and the sensor substrate is mounted on the projection. The projection may be projected from the main surface along a peripheral edge of the through-hole in the main surface.

According to one or more embodiments of the present invention, the microphone further includes an interposition member that is interposed between the main surface and the first surface while piercing the adhesive layer.

According to one or more embodiments of the present invention, the through-hole is made along a peripheral edge of the cavity in the first surface.

According to one or more embodiments of the present invention, a plurality of through-holes are made in the base substrate.

According to one or more embodiments of the present invention, the circuit element is stacked on the acoustic sensor.

According to one or more embodiments of the present invention, the diaphragm can be protected from the external environment, and the low-profile microphone can be constructed.

DETAILED DESCRIPTION

Figure 1:
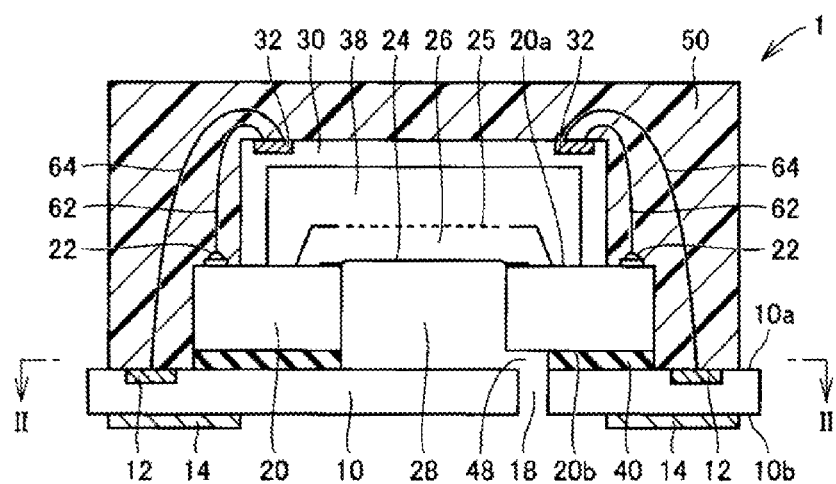
FIG. 1 is a sectional view illustrating a schematic configuration of a microphone according to a first embodiment.

Hereinafter, embodiments of the present invention will be described in detail with reference to the drawings. In the drawings, the identical or equivalent component is designated by the identical numeral, and the overlapping description is neglected. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 2:
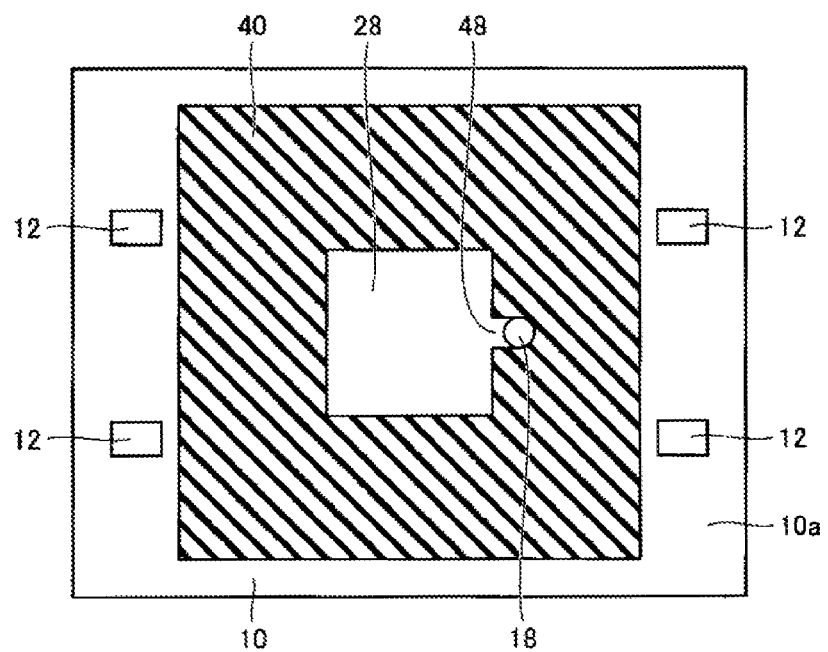
FIG. 2 is a sectional view taken along line II-II in FIG. 1 and illustrating the microphone of the first embodiment.

FIG. 1 is a sectional view illustrating a schematic configuration of a microphone 1 according to a first embodiment. FIG. 2 is a sectional view taken along line II-II in FIG. 1 and illustrating the microphone 1 of the first embodiment. Referring to FIG. 1, the microphone 1 is an MEMS (Micro Electro Mechanical System) microphone that is produced using a MEMS technology, and the microphone 1 includes a plate substrate 10, an acoustic sensor (microphone chip) mounted on the plate substrate 10, and a circuit element 30 stacked on the acoustic sensor.

The plate substrate 10 is a base substrate in the first embodiment, and is formed into a planar shape. The plate substrate 10 includes a main surface 10a and a connection surface 10b located on a side opposite to the main surface 10a. The acoustic sensor and the circuit element 30, which constitute the microphone 1, are disposed on the side of the main surface 10a of the plate substrate 10.

The plate substrate 10 includes a conductive layer 12 that is formed while exposed to the main surface 10a and an external connection terminal 14 that is stacked on the connection surface 10b. The external connection terminal 14 is electrically connected to a connection terminal on a mother substrate side in mounting the microphone 1 on the mother substrate, thereby performing power supply and control signal transmission to the microphone 1.

The plate substrate 10 is formed by a planar multilayer wiring board. In the plate substrate 10, a conductive layer (not illustrated) that extends in a planar direction on a surface and in an inside of the plate substrate 10 and a via electrode (not illustrated) that extends in a thickness direction are formed in addition to the conductive layer 12 and external connection terminal 14 in FIG. 1. The conductive layer 12 is electrically connected to the external connection terminal 14 through the via electrode formed in the plate substrate 10. As used herein, the planar direction means a direction in which the main surface 10a and connection surface 10b of the planar plate substrate 10 extend, that is, a direction orthogonal to the thickness direction of the plate substrate 10. In FIG. 1, a vertical direction is the thickness direction of the plate substrate 10, and a horizontal direction is the planar direction.

In addition to the multilayer wiring board, the plate substrate 10 may be formed by a copper-clad laminate, a glass epoxy board, a ceramic board, a plastic board, a metallic board, a carbon nanotube board, or a composite board thereof.

The acoustic sensor is mounted on the main surface 10a of the plate substrate 10. The acoustic sensor includes a sensor substrate 20, a diaphragm 24, and a backplate 25.

The sensor substrate 20 is formed by a silicon substrate. The sensor substrate 20 is formed into a planar shape, and includes a first surface 20b and a second surface 20a. The first surface 20b and the second surface 20a constitute both main surfaces of the sensor substrate 20. The first surface 20b is one of the main surfaces of the sensor substrate 20, and is opposed to the main surface 10a of the plate substrate 10. The second surface 20a is the other main surface of the sensor substrate 20, and is located on the side opposite to the first surface 20b.

An adhesive layer 40 is disposed between the first surface 20b of the sensor substrate 20 and the main surface 10a of the plate substrate 10. The adhesive layer 40 is interposed between the main surface 10a and the first surface 20b. The first surface 20b of the sensor substrate 20 adheres to the main surface 10a of the plate substrate 10 using the adhesive layer 40. The sensor substrate 20 is fixed to the main surface 10a of the plate substrate 10 by the adhesive layer 40, whereby the acoustic sensor is mounted on the main surface 10a of the plate substrate 10.

The adhesive layer 40 may be formed by an adhesive tape, an adhesive film, a liquid adhesive, a conductive adhesive, or a combination thereof. In the case that the adhesive layer 40 is formed using the liquid adhesive such as resin, desirably a drop position and a drop amount are adjusted in consideration of spread of the liquid adhesive after application. Alternatively, metallic films may be formed on the main surface 10a of the plate substrate 10 and the first surface 20b of the sensor substrate 20 and bonded to each other, thereby forming the adhesive layer 40.

A cavity 28 is formed in the sensor substrate 20. The cavity 28 is formed so as to reach the second surface 20a from the first surface 20b. The cavity 28 pierces the sensor substrate 20 in the thickness direction (vertical direction in FIG. 1). The cavity 28 is formed into a hollow shape. An inner peripheral surface of the cavity 28 is formed as a perpendicular surface extending in the thickness direction of the sensor substrate 20. The inner peripheral surface of the cavity 28 may be formed as a tapered surface inclined with respect to the thickness direction of the sensor substrate 20, or formed by a combination of a plurality of tapered surfaces having different inclination angles with respect to the thickness direction of the sensor substrate 20.

The diaphragm 24 is formed into a thin-film shape, and has electric conductivity. Desirably the diaphragm 24 is formed by polysilicon/single crystal silicon thin film to which an impurity is added. The diaphragm 24 is attached to the second surface 20a of the sensor substrate 20 using an anchor (not illustrated). The diaphragm 24 is disposed so as to cover the cavity 28 from the side of the second surface 20a. The diaphragm 24 includes an edge portion supported by the second surface 20a of the sensor substrate 20 and a central portion covering the cavity 28. The central portion of the diaphragm 24 is disposed while floated slightly from the second surface 20a of the sensor substrate 20, and the central portion of the diaphragm 24 performs a membrane vibration in a manner responsive to an acoustic vibration. The diaphragm 24 acts as a movable electrode of the acoustic sensor.

The backplate 25 is disposed on the side of the second surface 20a of the sensor substrate 20 while opposed to the diaphragm 24, and the backplate 25 is directly fixed to the second surface 20a of the sensor substrate 20 or fixed to the second surface 20a with one of layers interposed therebetween. The backplate 25 includes a fixed film made of an insulating layer, desirably silicon nitride/silicon with no impurity, and a fixed electrode made of a conductive layer, desirably polysilicon/single crystal silicon thin film to which an impurity is added/a metallic film. The fixed electrode is provided on the surface of the fixed film on one of the side opposed to the diaphragm 24 and the side that is not opposed to the diaphragm 24. The backplate 25 has a cap shape covering the diaphragm 24.

An air gap 26 is formed between the backplate 25 and the diaphragm 24. The backplate 25 covers the cavity 28 at a position farther away from the sensor substrate 20 with respect to the diaphragm 24. Many acoustic holes are made in the backplate 25 in order to avoid damping at the air gap 26. Desirably, the acoustic holes are made such that an aperture ratio is increased as much as possible as long as the backplate can ensure rigidity.

The fixed electrode of the backplate 25 and the diaphragm 24 that is of the movable electrode constitute a capacitor while being opposed to each other. When an acoustic wave is incident to the acoustic sensor, the diaphragm 24 vibrates by acoustic pressure to change an electrostatic capacitance between the diaphragm 24 and the fixed electrode of the backplate 25. In the acoustic sensor of the first embodiment, the acoustic vibration (change in acoustic pressure) detected by the diaphragm 24 brings about a change in electrostatic capacitance between the diaphragm 24 and the fixed electrode, and is output as an electric signal. At least one pair of microphone terminals 22 is provided in the second surface 20a of the sensor substrate 20. The microphone terminals 22 output a detection signal according to the change in electrostatic capacitance between the diaphragm 24 and the fixed electrode.

The acoustic sensor is not limited to the above configuration, but the acoustic sensor may have another configuration as long as the diaphragm 24 that is of the movable electrode and the fixed electrode are disposed while opposed to each other. For example, the positions of the diaphragm 24 and backplate 25 may be replaced with each other in the thickness direction of the sensor substrate 20. The diaphragm 24 may be suspended from the backplate 25 and supported by the backplate 25. In a modification in which the fixed electrode is provided in the sensor substrate 20 or another substrate, the backplate 25 may be eliminated.

The circuit element 30 is mounted on the second surface 20a of the sensor substrate 20, and stacked on the acoustic sensor. For example, the circuit element 30 may be an application specific integrated circuit (ASIC). The circuit element 30 has a downward angular C-shape, thereby forming a space 38 between the circuit element 30 and the second surface 20a of the sensor substrate 20. The diaphragm 24 and the backplate 25, which are provided in the second surface 20a of the sensor substrate 20, are accommodated in the space 38.

A conductive layer 32 is formed in the circuit element 30. The conductive layer 32 is provided in the surface of the circuit element 30 on the side opposite to the sensor substrate 20. The microphone terminal 22 disposed on the second surface 20a of the sensor substrate 20 and the conductive layer 32 formed in the circuit element 30 are connected to each other by a bonding wire 62. The conductive layer 12 formed in the plate substrate 10 and the conductive layer 32 formed in the circuit element 30 are connected to each other by a bonding wire 64. The detection signal of the acoustic sensor is output from the microphone terminal 22, and input to the circuit element 30 through the conductive layer 12. After the circuit element 30 performs predetermined signal processing to the detection signal, the detection signal is output from the circuit element 30, and output to the external connection terminal 14 through the conductive layer 12.

The acoustic sensor and the circuit element 30, which are sequentially stacked on the main surface 10a of the plate substrate 10, are wholly covered and protected by a protective layer 50. The protective layer 50 is made of an insulating resin. The bonding wires 62 and 64 are disposed in the protective layer 50, and protected by the protective layer 50. The plate substrate 10 and the protective layer 50 constitute a housing of the microphone 1.

Referring to FIGS. 1 and 2, a through-hole 18 piercing the plate substrate 10 in the thickness direction is made in the plate substrate 10. A hollow region 48 where the adhesive layer 40 is not provided is formed between the main surface 10a of the plate substrate 10 and the first surface 20b of the sensor substrate 20. When the plate substrate 10 and the sensor substrate 20 are viewed in the thickness direction (that is, the vertical direction in FIG. 1 and the direction perpendicular to the paper plane in FIG. 2), the through-hole 18 overlaps the sensor substrate 20, the hollow region 48 also overlaps the sensor substrate 20, and the through-hole 18 and the hollow region 48 overlap each other. The through-hole 18 and the hollow region 48 communicate with each other. The hollow region 48 is formed adjacent to the cavity 28, and the hollow region 48 communicates with the cavity 28. The through-hole 18 communicates with the cavity 28 through the hollow region 48.

The through-hole 18 and the hollow region 48 constitute an acoustic port through which the acoustic vibration is introduced to the acoustic sensor. The sound is introduced to the microphone 1 through the acoustic port. The microphone 1 includes a front chamber and a back chamber. The front chamber is a space located on the side closer to the acoustic port with respect to the diaphragm 24, and the back chamber is a hollow space located on the side farther away from the acoustic port with respect to the diaphragm 24. The front chamber and the back chamber are defined with the diaphragm 24 as a boundary. The cavity 28 acts as the front chamber of the microphone 1. The space 38 acts as the back chamber of the microphone 1.

The acoustic port includes the through-hole 18 made in the plate substrate 10. The acoustic port also includes the hollow region 48 that is surrounded by the main surface 10a of the plate substrate 10, the first surface 20b of the sensor substrate 20, and the adhesive layer 40. The through-hole 18 extends along the thickness direction of the plate substrate 10, and the hollow region 48 extends in the planar direction along the main surface 10a of the plate substrate 10. Therefore, because the extending direction of the through-hole 18 and the extending direction of the hollow region 48 intersect each other, the acoustic port constructed with the through-hole 18 and the hollow region 48 is formed into a bent shape.

The through-hole 18 is a round hole in which a circular shape emerges in the section of the plate substrate 10 parallel to the main surface 10a. When being viewed in the thickness direction of the plate substrate 10, the hollow region 48 has an area larger than that of the through-hole 18. In the through-hole 18, an opening at the main surface 10a of the plate substrate 10 is wholly exposed to the hollow region 48. A projection image formed by projecting the sensor substrate 20 on the main surface 10a along the thickness direction of the plate substrate 10 is wholly overlapped by the opening of the through-hole 18 at the main surface 10a.

When the through-hole 18 is viewed from the side of the connection surface 10b along the extending direction of the through-hole 18, the first surface 20b of the sensor substrate 20 is exclusively visible through the inside of the through-hole 18. The acoustic port has the bent shape such that the cavity 28 formed in the sensor substrate 20 and the diaphragm 24 covering the cavity 28 cannot directly be seen from the side of the connection surface 10b of the plate substrate 10.

According to the microphone 1 of the first embodiment, the acoustic port through which the acoustic vibration is introduced to the cavity 28 acting as the front chamber is formed into the bent shape, and the diaphragm 24 is disposed at the position that is not exposed to the external environment. Therefore, a foreign matter and compressed air are prevented from invading into the cavity 28 through the acoustic port and reaching the diaphragm 24, so that the breakage of the diaphragm 24 can be reduced. A foreign matter is prevented from reaching the diaphragm 24, so that the vibration of the diaphragm 24 is prevented from being affected by the foreign matter. Accordingly, the thin-film diaphragm 24 can be protected from the external environment.

The acoustic port having the bent shape is formed by the through-hole 18 piercing the plate substrate 10 and the hollow region 48. The hollow region 48 is surrounded by the main surface 10a of the plate substrate 10 and the first surface 20b of the sensor substrate 20 opposed to each other, and the adhesive layer 40. Therefore, it is not necessary to form a through-hole having the bent shape in the plate substrate 10, but the thickness of the plate substrate 10 can be reduced. As a result, a dimension is decreased in the height direction of the microphone 1, so that the low-profile microphone 1 can be constructed. The through-hole 18 extending linearly in the thickness direction of the plate substrate 10 is easily made, so that productivity can largely be improved compared with the case that the bent through-hole is made in the plate substrate 10.

The front chamber of the microphone 1 is formed by the cavity 28 formed in the sensor substrate 20. The diaphragm 24 can be disposed close to the main surface 10a of the plate substrate 10 because the breakage of the diaphragm 24 due to a foreign matter or compressed air, which invades through the acoustic port, can be suppressed. Therefore, the thickness of the sensor substrate 20 is reduced to achieve the low profile of the sensor substrate 20, so that the low profile of the microphone 1 can further be achieved. As a result of the low profile of the sensor substrate 20, because the volume of the front chamber is reduced, particularly a frequency characteristic of the microphone 1 can be improved in a high frequency band, and performance of the microphone 1 can be improved.

On the other hand, the back chamber of the microphone 1 is formed by the space 38 between the sensor substrate 20 and the circuit element 30. The shape and the dimensions of the circuit element 30 can arbitrarily be adjusted. When the dimension of the circuit element 30 having a downward C-shape is increased in the height direction, the volume of the space 38 can be increased to increase the volume of the back chamber.

As a result, air in the back chamber acts as an air spring to suppress disturbance to the vibration of the diaphragm 24, and the diaphragm 24 can vibrate freely in introducing the acoustic wave into the microphone 1. Accordingly, a signal-to-noise ratio (SNR) can be enhanced to improve sensitivity of the microphone 1. Additionally, the frequency characteristic of the microphone 1 can particularly be improved in a low frequency band by increasing the volume of the back chamber, and the performance of the microphone 1 can be improved.

The larger diameter of the acoustic port has an advantage in the characteristic of the microphone 1, and the shorter acoustic port has an advantage in the characteristic of the microphone 1. The acoustic port of the first embodiment includes the hollow region 48, and the hollow region 48 constitutes part of a passage of the sound introduced to the microphone 1. The hollow region 48 is formed by the formation of a cavity corresponding to the thickness of the adhesive layer 40 between the plate substrate 10 and the sensor substrate 20. That is, the diameter of the hollow region 48 depends on the thickness of the adhesive layer 40. Therefore, when the thickness of the adhesive layer 40 is sufficiently increased while the diameter of the through-hole 18 made in the plate substrate 10 is sufficiently increased, the acoustic performance equal to or greater than that of the conventional microphone can sufficiently be ensured. For example, the adhesive layer 40 having the thickness of 10 μm or more may be formed.

As illustrated in FIG. 1, the circuit element 30 is stacked on the acoustic sensor. The height dimension of the microphone 1 increases because of the stacked structure. For this reason, the thicknesses of the plate substrate 10 and the sensor substrate 20 are reduced using the acoustic port of the first embodiment. Therefore, the low profile of the microphone 1 can markedly be obtained. That is, the acoustic port of the first embodiment is particularly suitably applied to the microphone 1 in which the circuit element is stacked on the acoustic sensor.

Second Embodiment

Figure 3:
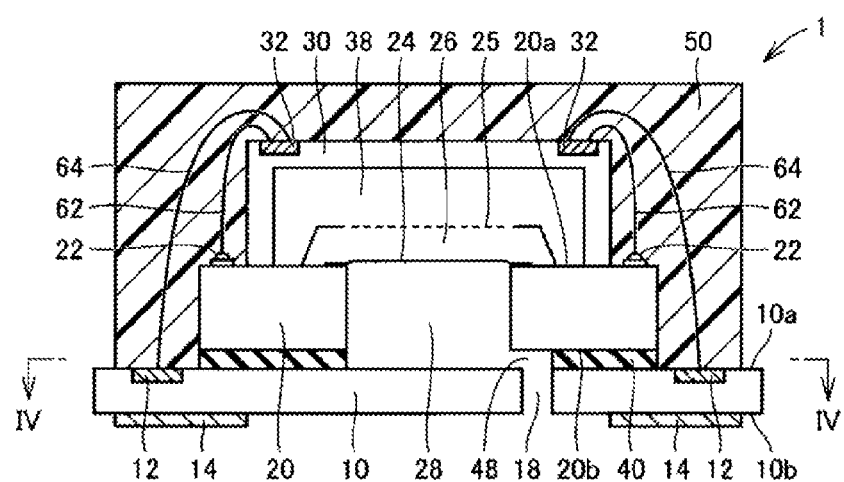
FIG. 3 is a sectional view illustrating a schematic configuration of a microphone according to a second embodiment.
Figure 4:
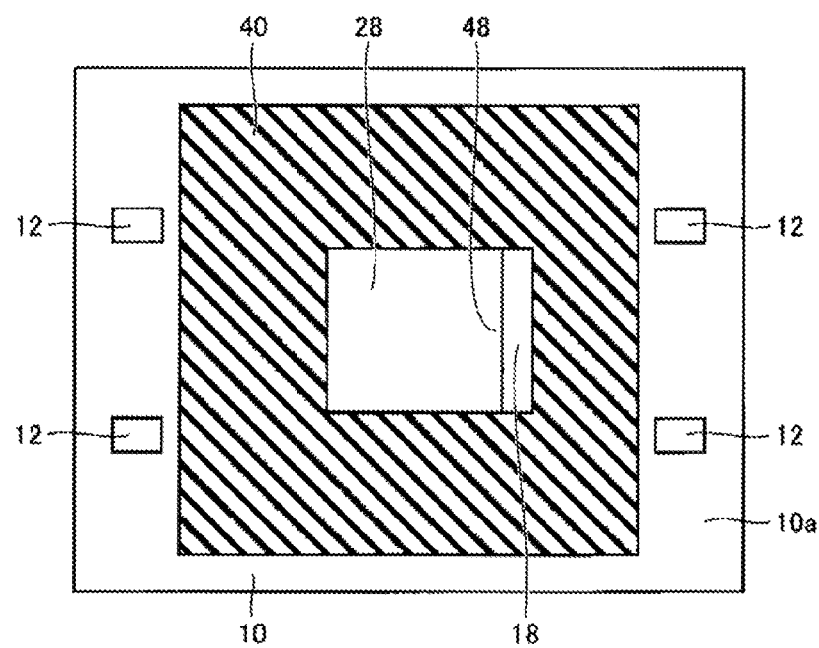
FIG. 4 is a sectional view taken along line IV-IV in FIG. 3 and illustrating the microphone of the second embodiment.

FIG. 3 is a sectional view illustrating a schematic configuration of a microphone 1 according to a second embodiment. FIG. 4 is a sectional view taken along line IV-IV in FIG. 3 and illustrating the microphone 1 of the second embodiment. The microphone 1 of the second embodiment differs from the microphone 1 of the first embodiment in the shape of the acoustic port formed by the through-hole 18 and the hollow region 48.

More specifically, the through-hole 18 and the hollow region 48 viewed from above are illustrated in the sectional view of FIG. 4. The through-hole 18 of the first embodiment in FIG. 2 has the round shape, while the through-hole 18 of the second embodiment has a slit-like shape. The through-hole 18 has the shape extending along an outer periphery of the cavity 28. The through-hole 18 is made along a peripheral edge of the cavity 28 in the first surface 20b of the sensor substrate 20.

The hollow region 48 is formed according to the slit-like through-hole 18 while the adhesive layer 40 is not provided in a region along the peripheral edge of the cavity 28 between the main surface 10a and the first surface 20b. The cavity 28 has a rectangular shape when viewed from above, and the through-hole 18 and the hollow region 48 are formed along one side of the rectangular shape.

According to the microphone 1 of the second embodiment, because the through-hole 18 is made along the peripheral edge of the cavity 28 in the first surface 20b as illustrated in FIG. 4, a sectional area of the through-hole 18 emerging on the section of the plate substrate 10 parallel to the main surface 10a is enlarged compared with the first embodiment. The through-hole 18 having the large opening area is made, and the hollow region 48 having the large opening area is also formed according to the through-hole 18, whereby the opening area of the acoustic port can be increased. Therefore, the microphone 1 having the better acoustic characteristic can be provided. The shape and the dimensions of the through-hole 18 may be defined such that the opening area of the through-hole 18 is increased as much as possible within a range where the rigidity of the plate substrate 10 can be ensured.

Third Embodiment

Figure 5:
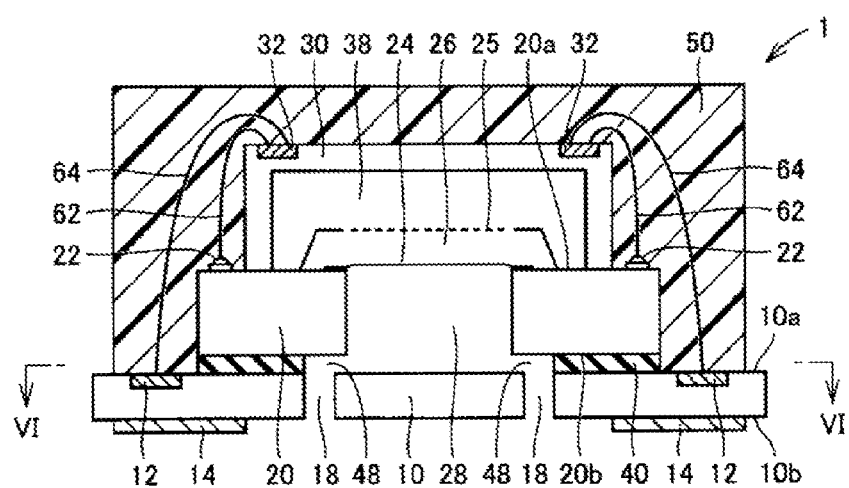
FIG. 5 is a sectional view illustrating a schematic configuration of a microphone according to a third embodiment.
Figure 6:
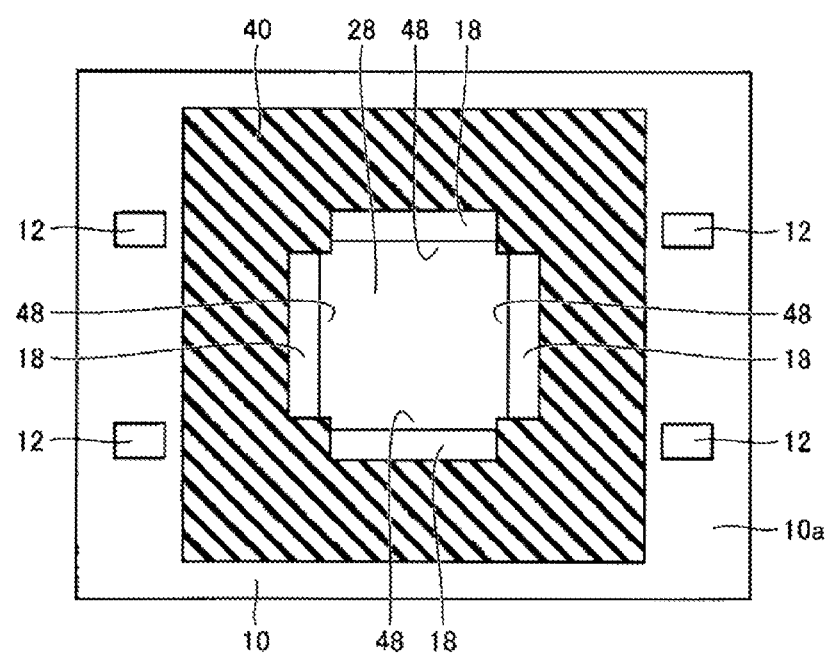
FIG. 6 is a sectional view taken along line VI-VI in FIG. 5 and illustrating the microphone of the third embodiment.

FIG. 5 is a sectional view illustrating a schematic configuration of a microphone 1 according to a third embodiment. FIG. 6 is a sectional view taken along line VI-VI in FIG. 5 and illustrating the microphone 1 of the third embodiment. The microphone 1 of the third embodiment differs from the microphone 1 of the second embodiment in the number of the acoustic ports formed by the through-holes 18 and the hollow regions 48.

More specifically, in the sectional view of FIG. 6, the cavity 28 has the rectangular shape when being viewed from above. The through-holes 18 of the third embodiment are made along all the four sides of the rectangle, while the through-hole 18 of the second embodiment is made along one side of the rectangle. The plurality of slit-like through-holes 18 are made in the plate substrate 10, and each through-hole 18 is made along a peripheral edge of the cavity 28 in the first surface 20b. Similarly to the second embodiment, the hollow region 48 is formed along the peripheral edge of the cavity 28 according to the slit-like through-hole 18.

According to the microphone 1 of the third embodiment, because the four slit-like through-holes 18 extending along the peripheral edge of the cavity 28 are made, the sectional area of the through-hole 18 emerging on the section of the plate substrate 10 parallel to the main surface 10a is enlarged compared with the second embodiment. The through-hole 18 having the large opening area is made, and the hollow region 48 having the large opening area is also formed according to the through-hole 18, whereby the opening area of the acoustic port can be increased. Therefore, the microphone 1 having the better acoustic characteristic can be provided. The number of the through-holes 18 may be increased as much as possible within the range where the rigidity of the plate substrate 10 can be ensured.

Fourth Embodiment

Figure 7:
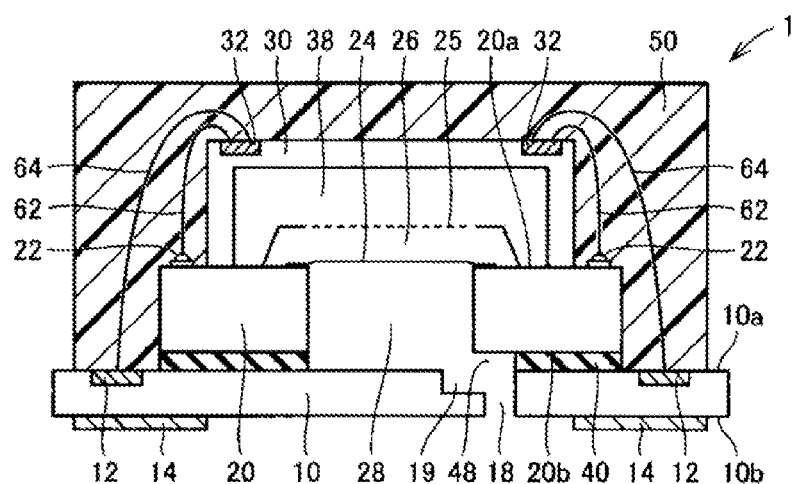
FIG. 7 is a sectional view illustrating a schematic configuration of a microphone according to a fourth embodiment.

FIG. 7 is a sectional view illustrating a schematic configuration of a microphone 1 according to a fourth embodiment. The microphone 1 of the fourth embodiment differs from the microphone 1 of the first embodiment in that a recess 19 in which the main surface 10a of the plate substrate 10 is recessed is formed in the plate substrate 10.

The recess 19 is formed adjacent to the through-hole 18. In the recess 19, the main surface 10a on the side adjacent to the cavity 28 is recessed toward the side of the connection surface 10b with respect to the through-hole 18. The through-hole 18 communicates with the cavity 28 through the hollow region 48, and also communicates with the cavity 28 through the recess 19. The recess 19 and the hollow region 48 communicate with each other. The recess 19, the through-hole 18, and the hollow region 48 constitute the acoustic port through which the acoustic vibration is introduced to the acoustic sensor. The shape of the through-hole 18 may be the round hole like in the first embodiment or the slit-like hole like in the second embodiment.

According to the microphone 1 of the fourth embodiment, because of the formation of the recess 19 in which the main surface 10a of the plate substrate 10 is recessed, the opening area of the acoustic port by which the external space of the microphone 1 communicates with the cavity 28 is enlarged compared with the first embodiment. The microphone 1 having the better acoustic characteristic can be provided by enlarging the opening area of the acoustic port.

Fifth Embodiment

Figure 8:
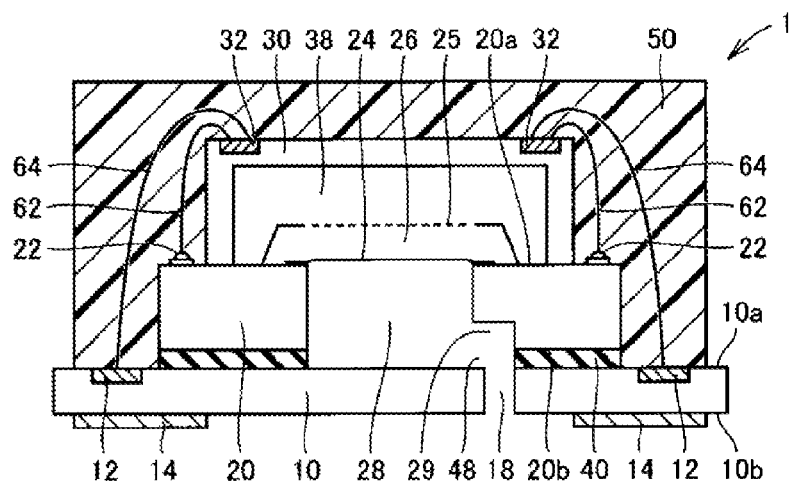
FIG. 8 is a sectional view illustrating a schematic configuration of a microphone according to a fifth embodiment.

FIG. 8 is a sectional view illustrating a schematic configuration of a microphone 1 according to a fifth embodiment. The microphone 1 of the fifth embodiment differs from the microphone 1 of the first embodiment in that a recess 29 in which the first surface 20b of the sensor substrate 20 is recessed is formed in the sensor substrate 20.

The recess 29 is formed as an extension of the through-hole 18. In the recess 29, a portion corresponding to a projection image of the through-hole 18 on the first surface 20b of the sensor substrate 20 is recessed toward the side of the second surface 20a, and the first surface 20b on the side of the cavity 28 with respect to the portion is formed while recessed. The recess 29 communicates with the cavity 28. The through-hole 18 communicates with the cavity 28 through the hollow region 48, and also communicates with the cavity 28 through the recess 29. The recess 29 and the hollow region 48 communicate with each other. The recess 29, the through-hole 18, and the hollow region 48 constitute the acoustic port. The shape of the through-hole 18 may be the round hole like in the first embodiment or the slit-like hole like in the second embodiment.

According to the microphone 1 of the fifth embodiment, because of the formation of the recess 29 in which the first surface 20b of the sensor substrate 20 is recessed, the opening area of the acoustic port by which the external space of the microphone 1 communicates with the cavity 28 is enlarged compared with the first embodiment. Accordingly, the microphone 1 having the better acoustic characteristic can be provided similarly to the fourth embodiment.

Sixth Embodiment

Figure 9:
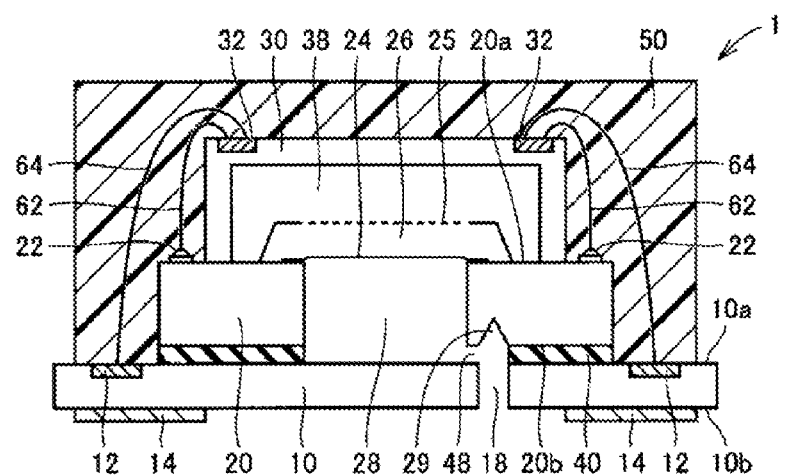
FIG. 9 is a sectional view illustrating a schematic configuration of a microphone according to a sixth embodiment.

FIG. 9 is a sectional view illustrating a schematic configuration of a microphone 1 according to a sixth embodiment. The microphone 1 of the sixth embodiment differs from the microphone 1 of the fifth embodiment in the shape of the recess 29 formed in the sensor substrate 20.

In FIG. 8, a bottom surface of the recess 29 of the fifth embodiment is formed in substantially parallel to the first surface 20b of the sensor substrate 20, and the recess 29 has the rectangular shape in section. On the other hand, the recess 29 of the sixth embodiment in FIG. 9 includes an inner wall surface inclined with respect to the first surface 20b of the sensor substrate 20, the recess 29 is formed into a tapered shape, and the recess 29 has a substantially triangular shape in section. For example, the recess 29 in FIG. 8 having the rectangular shape in section can be formed using isotropic etching. For example, the recess 29 in FIG. 9 having the triangular shape in section can be formed using anisotropic etching.

According to the microphone 1 of the sixth embodiment, the microphone 1 having the better acoustic characteristic can be provided because the opening area of the acoustic port is enlarged similarly to the fifth embodiment. In FIG. 9, the portion in which the first surface 20b is not recessed because the sensor substrate 20 is not processed exists between the recess 29 and the cavity 28. However, when the thickness of the adhesive layer 40 is ensured to sufficiently enlarge the opening area of the hollow region 48, the good acoustic characteristic of the microphone 1 can be ensured.

Seventh Embodiment

Figure 10:
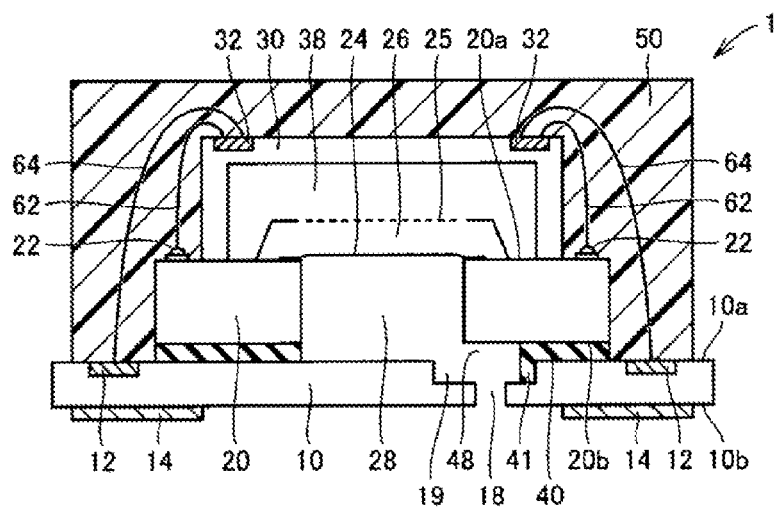
FIG. 10 is a sectional view illustrating a schematic configuration of a microphone according to a seventh embodiment.

FIG. 10 is a sectional view illustrating a schematic configuration of a microphone 1 according to a seventh embodiment. The microphone 1 of the seventh embodiment basically includes the configuration similar to that of the microphone 1 of the fourth embodiment, and the recess 19 in which the main surface 10a of the plate substrate 10 is recessed is formed in the plate substrate 10. However, the seventh embodiment differs from the fourth embodiment in that the recess 19 is formed into the shape in FIG. 10.

Specifically, in the recess 19 of the seventh embodiment, the main surface 10a is recessed on the side of the cavity 28 with respect to the through-hole 18, and the main surface 10a is recessed on the side farther away from the cavity 28 with respect to the through-hole 18. An adhesive cured material 41 is accommodated in a part of the recess 19 on the side farther away from the cavity 28 with respect to the through-hole 18. The adhesive cured material 41 is formed such that part of the liquid adhesive, which is applied to the main surface 10a in order to cause the acoustic sensor to adhere to the plate substrate 10, flows in the recess 19 and is cured in the recess 19.

In the microphone 1 of the seventh embodiment, the liquid adhesive such as a liquid resin is used to mount the acoustic sensor on the main surface 10a of the plate substrate 10. The sensor substrate 20 is caused to adhere to the plate substrate 10 using the liquid adhesive. In this case, the recess 19 is used as a reservoir (liquid accumulating portion) for the liquid adhesive. When the recess 19 is formed in the main surface 10a on the side farther away from the cavity 28 with respect to the through-hole 18, even if the liquid adhesive having fluidity flows in the recess 19, the liquid adhesive is cured without reaching the through-hole 18. As a result, the microphone 1 includes the adhesive cured material 41 accommodated in the recess 19. Therefore, the liquid adhesive is prevented from closing the acoustic port, so that the predetermined acoustic characteristic of the microphone 1 can be ensured.

Eighth Embodiment

Figure 11:
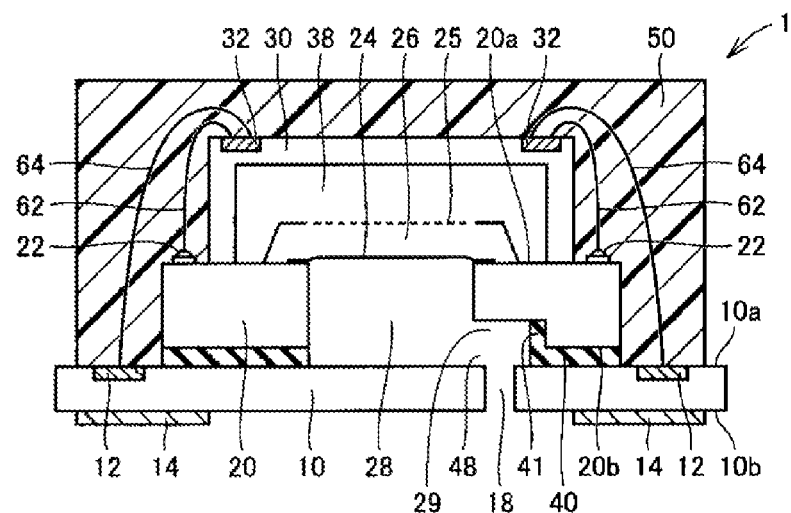
FIG. 11 is a sectional view illustrating a schematic configuration of a microphone according to an eighth embodiment.

FIG. 11 is a sectional view illustrating a schematic configuration of a microphone 1 according to an eighth embodiment. The microphone 1 of the eighth embodiment basically includes the configuration similar to that of the microphone 1 of the fifth embodiment, and the recess 29 in which the first surface 20b of the sensor substrate 20 is recessed is formed in the sensor substrate 20. However, the eighth embodiment differs from the fifth embodiment in that the recess 29 is formed into the shape in FIG. 11.

Specifically, in the recess 29 of the eighth embodiment, the first surface 20b is recessed in the portion corresponding to a projection image of the through-hole 18 on the first surface 20b, the first surface 20b is recessed on the side of the cavity 28 with respect to the projection image, and the first surface 20b is recessed on the side farther away from the cavity 28 with respect to the projection image. The adhesive cured material 41 is accommodated in a part of the recess 29 on the side farther away from the cavity 28 with respect to the through-hole 18. The adhesive cured material 41 is formed such that part of the liquid adhesive, which is applied to the main surface 10a in order to cause the acoustic sensor to adhere to the plate substrate 10, flows in the recess 29 and is cured in the recess 29.

Similarly to the seventh embodiment, in the microphone 1 of the eighth embodiment, the sensor substrate 20 is caused to adhere to the plate substrate 10 using the liquid adhesive. The recess 29 is used as the reservoir for the liquid adhesive. Therefore, the liquid adhesive is prevented from closing the acoustic port, so that the predetermined acoustic characteristic of the microphone 1 can be ensured.

Ninth Embodiment

Figure 12:
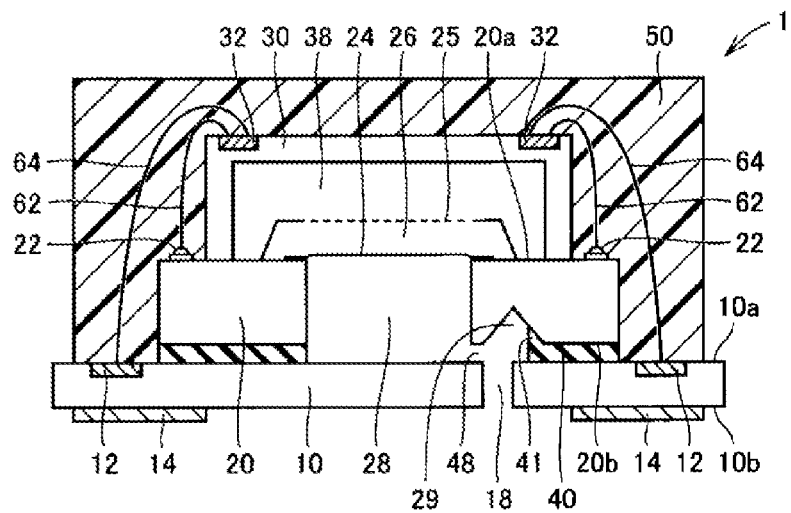
FIG. 12 is a sectional view illustrating a schematic configuration of a microphone according to a ninth embodiment.

FIG. 12 is a sectional view illustrating a schematic configuration of a microphone 1 according to a ninth embodiment. The microphone 1 of the ninth embodiment basically includes the configuration similar to that of the microphone 1 of the sixth embodiment, and the recess 29 in which the first surface 20b of the sensor substrate 20 is recessed is formed in the sensor substrate 20. However, the ninth embodiment differs from the sixth embodiment in that the recess 29 is formed into the shape in FIG. 12.

Specifically, in the recess 29 of the ninth embodiment, the first surface 20b is recessed in the portion corresponding to a projection image of the through-hole 18 on the first surface 20b, and the first surface 20b is recessed on the side farther away from the cavity 28 with respect to the projection image. The adhesive cured material 41 is accommodated in a part of the recess 29 on the side farther away from the cavity 28 with respect to the through-hole 18.

Similarly to the seventh embodiment, in the microphone 1 of the ninth embodiment, the sensor substrate 20 is caused to adhere to the plate substrate 10 using the liquid adhesive. The recess 29 is used as the reservoir for the liquid adhesive. Therefore, the liquid adhesive is prevented from closing the acoustic port, so that the predetermined acoustic characteristic of the microphone 1 can be ensured.

Tenth Embodiment

Figure 13:
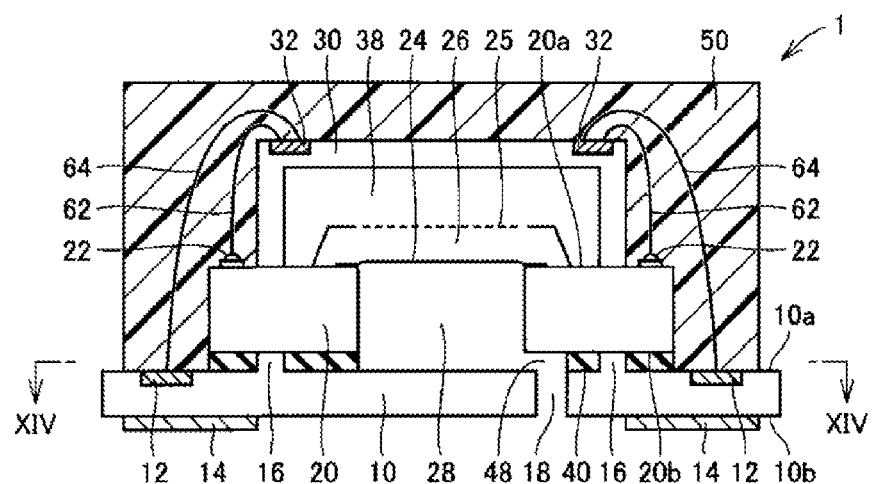
FIG. 13 is a sectional view illustrating a schematic configuration of a microphone according to a tenth embodiment.
Figure 14:
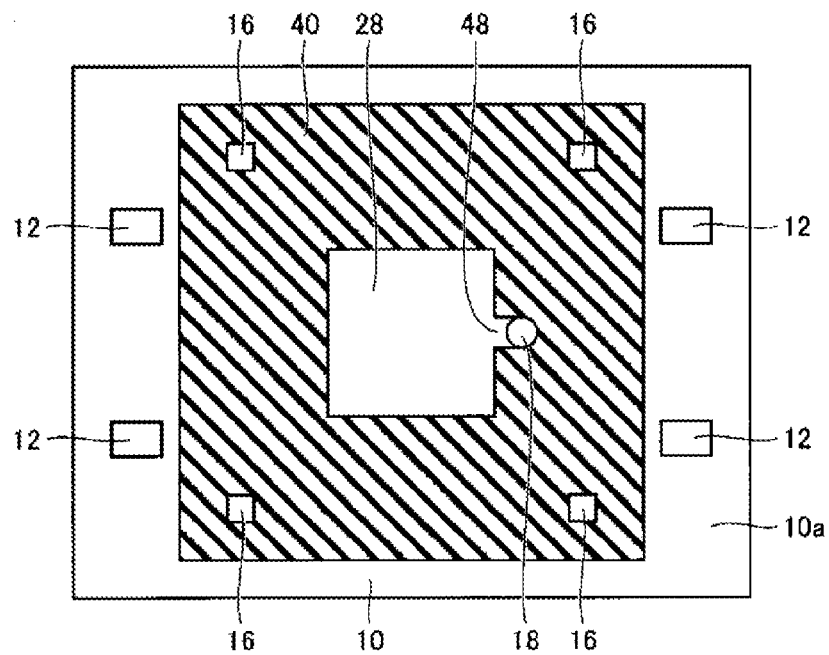
FIG. 14 is a sectional view taken along line XIV-XIV in FIG. 13 and illustrating the microphone of the tenth embodiment.

FIG. 13 is a sectional view illustrating a schematic configuration of a microphone 1 according to a tenth embodiment. FIG. 14 is a sectional view taken along line XIV-XIV in FIG. 13 and illustrating the microphone 1 of the tenth embodiment. The microphone 1 of the tenth embodiment differs from that of the first embodiment in the shape on the side of the main surface 10a of the plate substrate 10.

More specifically, the plate substrate 10 includes projections 16 projected from the main surface 10a. The plurality of projections 16 are formed so as to surround the cavity 28 of the sensor substrate 20. The four projections 16 are formed in the tenth embodiment in FIG. 14. In the projection 16, a leading end portion farthest away from the main surface 10a is formed into a flat shape. The leading end portions of the projections 16 are disposed on the identical plane parallel to the main surface 10a of the plate substrate 10. The sensor substrate 20 of the acoustic sensor is mounted on the projections 16. The first surface 20b of the sensor substrate 20 is in surface contact with the leading end surfaces of the projections 16, and is supported by the projections 16.

The main surface 10a of the plate substrate 10 and the first surface 20b of the sensor substrate 20 are disposed with a gap of the height of the projection 16. The adhesive layer 40 interposed between the main surface 10a and the first surface 20b has the thickness identical to the height of the projection 16.

In the case that the liquid adhesive is used, the first surface 20b of the sensor substrate 20 is supported by the projections 16 while the adhesive layers adjacent to the leading end surfaces of the projections 16 are interposed between the first surface 20b and the leading end surfaces. The adhesive layer 40 interposed between the main surface 10a and the first surface 20b has the thickness in which the height of the projection 16 and the thickness of the resin remaining on the leading end surface of the projection 16 are added to each other. The thickness of the resin remaining on the leading end surface of the projection 16 depends on the viscosity of the liquid adhesive, the pressure on the liquid adhesive during the mounting, and the shape of the projection 16.

According to the microphone 1 of the tenth embodiment, the plurality of projections 16 projected from the main surface 10a are provided in the plate substrate 10, and the sensor substrate 20 is mounted on the projections 16. The adhesive layer 40 causing the sensor substrate 20 to adhere to the plate substrate 10 is disposed between the main surface 10a of the plate substrate 10 and the first surface 20b of the sensor substrate 20. The thickness of the adhesive layer 40 can freely be changed by adjusting a projection height in which the projection 16 is projected from the main surface 10a. The dimensions of the hollow region 48 in the thickness direction of the plate substrate 10 depend on the thickness of the adhesive layer 40. Therefore, the opening area of the hollow region 48 can be adjusted according to the dimensions of the projection 16.

As described above, the hollow region 48 constitutes the acoustic port through which the acoustic vibration is introduced to the acoustic sensor, and the microphone 1 has the greater advantage in the characteristic with increasing opening area of acoustic port. The projections 16 are formed in the plate substrate 10, and the thickness of the adhesive layer 40 is decided by the projections 16, whereby the dimension can sufficiently be increased in the height direction of the hollow region 48 to form the acoustic port having the sufficiently large opening area. Accordingly, the acoustic performance of the microphone 1 can sufficiently be ensured. The thickness is stabilized over the whole adhesive layer 40 to reduce a variation in thickness of the adhesive layer 40, so that a variation in acoustic characteristics can be reduced among individual microphones 1.

Eleventh Embodiment

Figure 15:
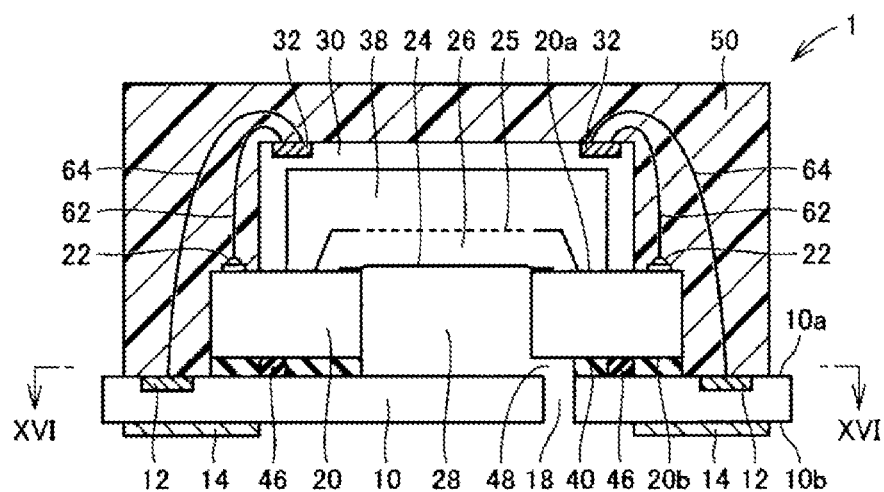
FIG. 15 is a sectional view illustrating a schematic configuration of a microphone according to an eleventh embodiment.
Figure 16:
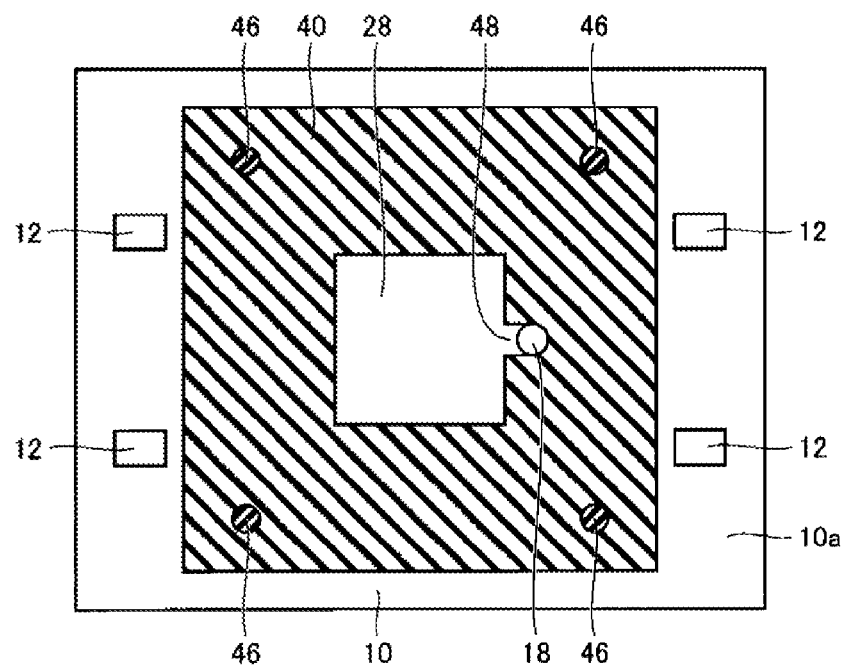
FIG. 16 is a sectional view taken along line XVI-XVI in FIG. 15 and illustrating the microphone of the eleventh embodiment.

FIG. 15 is a sectional view illustrating a schematic configuration of a microphone 1 according to an eleventh embodiment. FIG. 16 is a sectional view taken along line XVI-XVI in FIG. 15 and illustrating the microphone 1 of the eleventh embodiment. The microphone 1 of the eleventh embodiment differs from that of the first embodiment in that the microphone 1 further includes interposition members 46 interposed between the main surface 10a of the plate substrate and the first surface 20b of the sensor substrate 20.

The interposition members 46 are mounted on the main surface 10a of the plate substrate 10, and disposed so as to be projected from the main surface 10a. The plurality of interposition members 46 are provided so as to surround the cavity 28 of the sensor substrate 20. The four interposition members 46 are disposed in the eleventh embodiment in FIG. 16. The sensor substrate 20 of the acoustic sensor is mounted on the interposition members 46. The first surface 20b of the sensor substrate 20 is in contact with the interposition members 46, and is supported by the interposition members 46.

The main surface 10a of the plate substrate 10 and the first surface 20b of the sensor substrate 20 are disposed with the gap of the dimension in the height direction of the interposition member 46. The interposition member 46 is disposed while piercing the adhesive layer 40. The adhesive layer 40 interposed between the main surface 10a and the first surface 20b has the thickness identical to the height of the interposition member 46.

According to the microphone 1 of the eleventh embodiment, the plurality of interposition members 46 are disposed while piercing the adhesive layer 40 between the main surface 10a of the plate substrate 10 and the first surface 20b of the sensor substrate 20. The sensor substrate 20 is mounted on the interposition members 46. The thickness of the adhesive layer 40 can freely be changed by adjusting the dimension of the interposition member 46 in the thickness direction of the plate substrate 10. The dimensions of the hollow region 48 in the thickness direction of the plate substrate 10 depend on the thickness of the adhesive layer 40. Therefore, the opening area of the hollow region 48 can be adjusted according to the dimensions of the interposition member 46.

Similarly to the tenth embodiment, the thickness of the adhesive layer 40 is decided by the interposition members 46, whereby the dimension can sufficiently be increased in the height direction of the hollow region 48 to form the acoustic port having the sufficiently large opening area. Accordingly, the acoustic performance of the microphone 1 can sufficiently be ensured, and the variation in acoustic characteristics can be reduced among individual microphones 1.

Twelfth Embodiment

Figure 17:
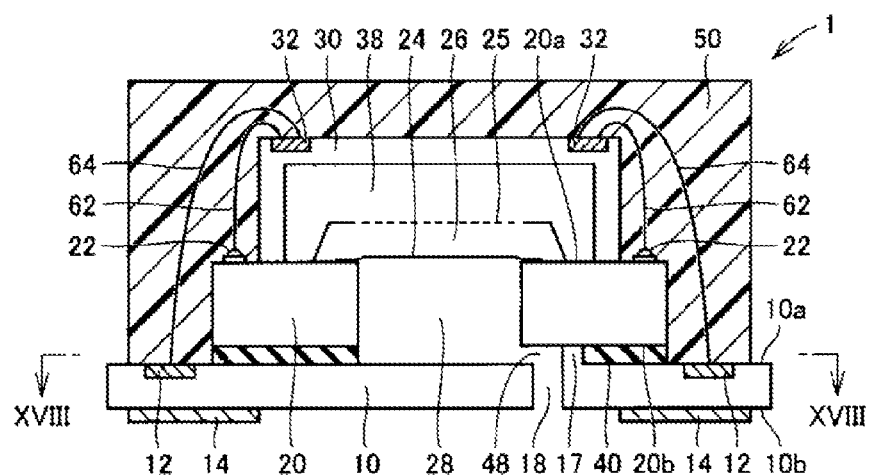
FIG. 17 is a sectional view illustrating a schematic configuration of a microphone according to a twelfth embodiment.
Figure 18:
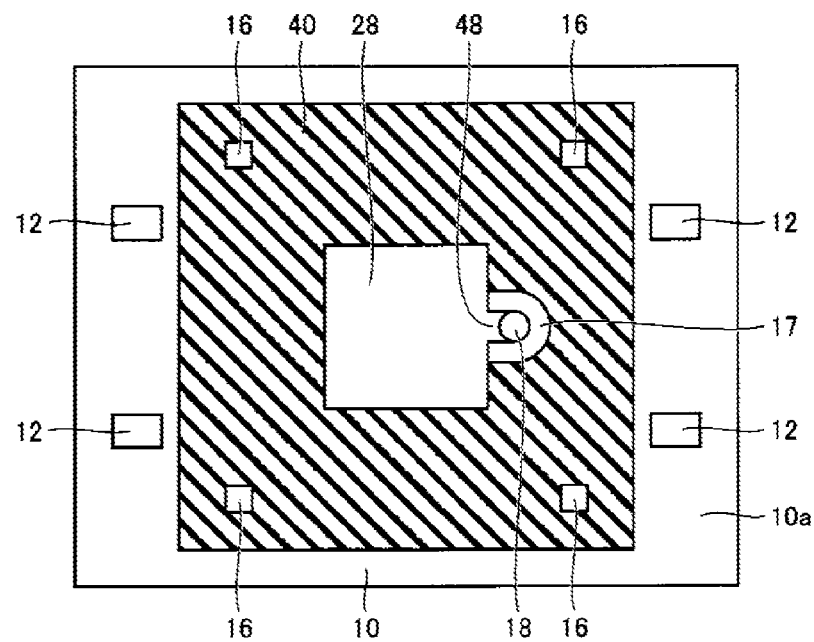
FIG. 18 is a sectional view taken along line XVIII-XVIII in FIG. 17 and illustrating the microphone of the twelfth embodiment.

FIG. 17 is a sectional view illustrating a schematic configuration of a microphone 1 according to a twelfth embodiment. FIG. 18 is a sectional view taken along line XVIII-XVIII in FIG. 17 and illustrating the microphone 1 of the twelfth embodiment. In the microphone 1 of the twelfth embodiment, the plate substrate 10 includes a projection 17 projected from the main surface 10a in addition to the projections 16 similar to those of the tenth embodiment. The leading end surfaces of the projections 16 and the leading end surface of the projection 17 are disposed on the identical surface. The sensor substrate 20 is mounted on the projections 16 and 17, and supported by both the projections 16 and 17.

The through-hole 18 is made while piercing the plate substrate 10 in the thickness direction, and the through-hole 18 is opened at the main surface 10a. As illustrated in FIG. 18, the projection 17 is provided so as to be projected from the main surface 10a along the peripheral edge of the through-hole 18 in the main surface 10a. The through-hole 18 in FIG. 18 has the round shape, and the projection 17 includes an arc-like portion extending along an outer circumference of the round hole. The outer circumference of the through-hole 18 is partially surrounded by the projection 17. The adhesive layer 40 is separated from the through-hole 18 by the projection 17.

In the microphone 1 of the twelfth embodiment, the liquid adhesive such as the liquid resin is used to mount the acoustic sensor on the main surface 10a of the plate substrate 10. The sensor substrate 20 is caused to adhere to the plate substrate 10 using the liquid adhesive. When the liquid adhesive is supplied to the main surface 10a, the projection 17 dams the flow of the liquid adhesive having the fluidity even if the liquid adhesive moves in the planar direction along the main surface 10a. The projection 17 acts as a barrier against the flow of the liquid adhesive. Accordingly, the liquid adhesive is prevented from reaching the through-hole 18 and flowing into the through-hole 18, and the liquid adhesive is prevented from closing the acoustic port, so that the predetermined acoustic characteristic of the microphone 1 can be ensured.

Thirteenth Embodiment

Figure 19:
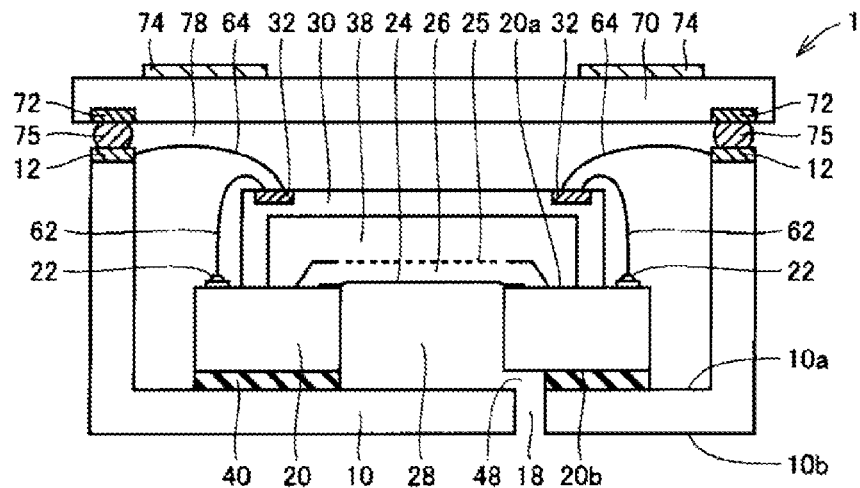
FIG. 19 is a sectional view illustrating a schematic configuration of a microphone according to a thirteenth embodiment.

FIG. 19 is a sectional view illustrating a schematic configuration of a microphone 1 according to a thirteenth embodiment. In the first to twelfth embodiments, acoustic sensor is mounted on the planar plate substrate 10. On the other hand, in the microphone 1 of the thirteenth embodiment, the plate substrate 10 is formed into a shape in which an angular character C is laid. The plate substrate 10 having the laid C-shape may be formed by cutting, or formed by attaching frames on peripheral edge portions of the planar multilayer wiring board. The acoustic sensor is mounted on the bottom surface of the plate substrate 10 having the laid C-shape.

The microphone 1 of the thirteenth embodiment also includes a cap substrate 70. The stacked structure of the acoustic sensor and the circuit element 30 is accommodated in an internal space of a package that is formed by the plate substrate 10 and the cap substrate 70. The plate substrate 10 and the cap substrate 70 constitute the housing of the microphone 1 of the thirteenth embodiment. A hollow space 78 is formed in the housing, and surrounded by the plate substrate 10, the cap substrate 70, the acoustic sensor, and the circuit element 30.

Similarly to the plate substrate 10 of the first embodiment, the cap substrate 70 is formed by the planar multilayer wiring board. The cap substrate 70 includes a conductive layer 72 exposed to the main surface on the side opposed to the acoustic sensor and an external connection terminal 74 stacked on the main surface on the side that is not opposed to the acoustic sensor. In the cap substrate 70, a conductive layer (not illustrated) that extends in the planar direction on the surface and in the inside of the cap substrate 70 and a via electrode (not illustrated) that extends in the thickness direction are formed in addition to the conductive layer 72 and the external connection terminal 74 in FIG. 19.

The external connection terminal 74 is electrically connected to the connection terminal on the mother substrate side in mounting the microphone 1 on the mother substrate, thereby performing the power supply and the control signal transmission to the microphone 1. Therefore, unlike in the first embodiment, the external connection terminal is not provided in the plate substrate 10 in FIG. 19. The conductive layer 12 is exposed to the leading end portion of the C-shape of the plate substrate 10. The conductive layer 12 and the conductive layer 72 formed in the cap substrate 70 are disposed while opposed to each other. The conductive layer 12 and the conductive layer 72 are electrically connected to each other with a conductive member 75 interposed therebetween. The conductive member 75 is formed by a conductive adhesive, solder, a conductive double-sided adhesive tape, a brazing material, or a combination thereof.

The conductive layer 12 formed in the plate substrate 10 and the conductive layer 32 formed in the circuit element 30 are connected to each other by the bonding wire 64. Compared with the first embodiment, the wire length of the bonding wire 64 is decreased. Therefore, the bonding wire 64 is hardly cut off, and wire bonding work can be facilitated.

A top-port type microphone 1 is constructed by the above configuration. The top-port type microphone 1 includes the external connection terminal 74, and the acoustic port is provided at the position distant from the cap substrate 70 mounted on the mother substrate. In the microphone 1 of the thirteenth embodiment, similarly to the first embodiment, the acoustic port through which the acoustic vibration is introduced to the cavity 28 is formed into the bent shape. The acoustic port having the bent shape is formed by the through-hole 18 and the hollow region 48. Therefore, the breakage of the diaphragm 24 can be reduced because a foreign matter and compressed air are restrained from invading into the cavity 28 through the acoustic port and reaching the diaphragm 24. Additionally, the thickness of the plate substrate 10 is decreased to reduce the dimension in the height direction of the microphone 1, so that the low-profile microphone 1 can be constructed.

In the configuration of the thirteenth embodiment in FIG. 19, the spaces 38 and 78 can communicate with each other by providing the gap between the acoustic sensor and the circuit element 30. Therefore, the volume of the back chamber of the microphone 1 can further be enlarged. In this case, it is necessary that the portion in which the conductive member 75 exists intermittently be filled with the insulating resin to acoustically seal the spaces 38 and 78 from the outside.

Fourteenth Embodiment

Figure 20:
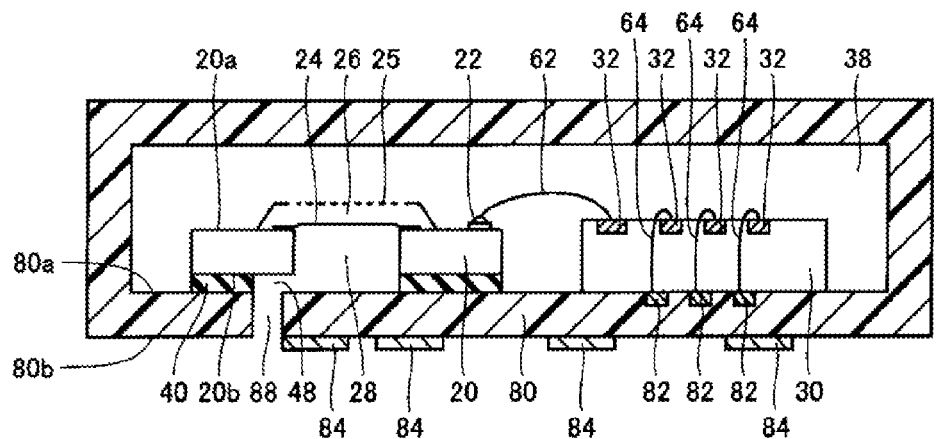
FIG. 20 is a sectional view illustrating a schematic configuration of a microphone according to a fourteenth embodiment.

FIG. 20 is a sectional view illustrating a schematic configuration of a microphone 1 according to a fourteenth embodiment. In the first to thirteenth embodiments, the acoustic sensor and the circuit element 30 are stacked on each other to form the stacked structure. On the other hand, in the microphone 1 of the fourteenth embodiment, the circuit element 30 is not stacked on the acoustic sensor, but the acoustic sensor and the circuit element 30 are mounted on the base substrate while arrayed on the base substrate.

The microphone 1 in FIG. 20 includes a package 80. The package 80 constitutes the housing of the microphone 1 of the fourteenth embodiment. The package 80 has a hollow box shape, and a hollow space is formed in the package 80. In the internal space of the package 80, the cavity 28 acts as the front chamber of the microphone 1, and the space 38 on the side opposite to the cavity 28 with respect to the diaphragm 24 acts as the back chamber of the microphone 1. Similarly to the plate substrate 10 of the first embodiment, the package 80 is formed by the planar multilayer wiring board. The package 80 includes a main surface 80a and a connection surface 80b on the side opposite to the main surface 80a. Both the acoustic sensor and the circuit element 30 are mounted on the main surface 80a. The package 80 acts as the base substrate of the fourteenth embodiment.

The package 80 includes a conductive layer 82 that is formed while exposed to the main surface 80a and an external connection terminal 84 that is stacked on the connection surface 80b. In the package 80, a conductive layer (not illustrated) that extends in the planar direction on the surface and in the inside of the package 80 and a via electrode (not illustrated) that extends in the thickness direction are formed in addition to the conductive layer 82 and the external connection terminal 84 in FIG. 20. The conductive layer 32 formed in the circuit element 30 and the conductive layer 82 formed in the package 80 are connected to each other by the bonding wire 64. A through-hole 88 is made in the package 80 while piercing the package 80 in the thickness direction. The through-hole 88 partially constitutes the acoustic port.

In the microphone 1 of the fourteenth embodiment having the above configuration, similarly to the first embodiment, the acoustic port through which the acoustic vibration is introduced to the cavity 28 is formed into the bent shape. The acoustic port having the bent shape is formed by the through-hole 88 and the hollow region 48. Therefore, the breakage of the diaphragm 24 can be reduced because a foreign matter and compressed air are restrained from invading into the cavity 28 through the acoustic port and reaching the diaphragm 24. Additionally, the volume of the back chamber is increased by reducing the dimension in the height direction of the microphone 1, so that the performance of the microphone 1 can be improved.

Fifteenth Embodiment

Figure 21:
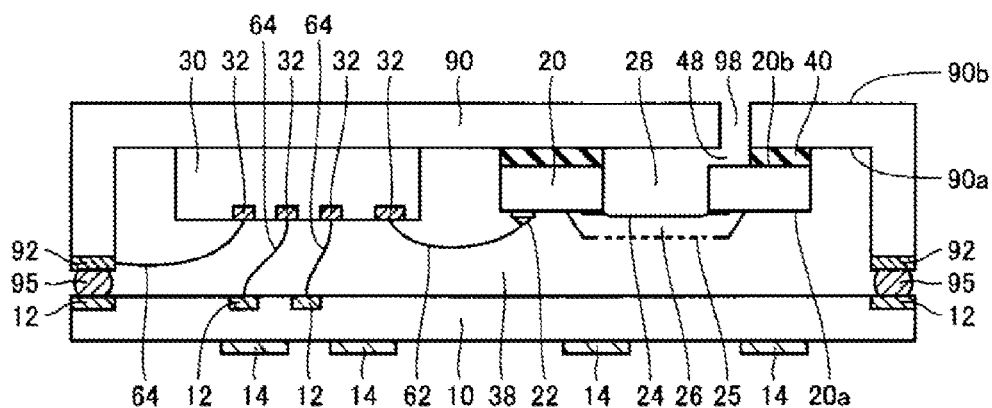
FIG. 21 is a sectional view illustrating a schematic configuration of a microphone according to a fifteenth embodiment.

FIG. 21 is a sectional view illustrating a schematic configuration of a microphone 1 according to a fifteenth embodiment. The microphone 1 of the fifteenth embodiment includes a cover member 90 having a downward angular C-shape. The cover member 90 is made of an insulating material typified by a resin material. The plate substrate 10 and the cover member 90 are assembled into a hollow box shape, and a hollow space is formed in the box shape. The acoustic sensor and the circuit element 30 are accommodated in the internal space of the package that is formed by the plate substrate 10 and the cover member 90. The plate substrate 10 and the cover member 90 constitute the housing of the microphone 1 of the fifteenth embodiment.

The cover member 90 includes a main surface 90a on the side opposed to the plate substrate 10 and an outer surface 90b on the side opposite to the main surface 90a. Both the acoustic sensor and the circuit element 30 are mounted on the main surface 90a of the cover member 90. The cover member 90 acts as a base member of the fifteenth embodiment. In the box-shape internal space formed by the plate substrate 10 and the cover member 90, the cavity 28 acts as the front chamber of the microphone 1, and the space 38 on the side opposite to the cavity 28 with respect to the diaphragm 24 acts as the back chamber of the microphone 1.

A conductive layer 92 is exposed to the leading end portion of the C-shape of the cover member 90. The conductive layer 92 and the conductive layer 12 formed in the plate substrate 10 are disposed while opposed to each other. The conductive layer 12 and the conductive layer 92 are electrically connected to each other with a conductive member 95 interposed therebetween. The conductive member 95 is formed by a conductive adhesive, solder, a conductive double-sided adhesive tape, a brazing material, or a combination thereof. It is necessary that the portion in which the conductive member 95 exists intermittently be filled with the insulating resin to acoustically seal the space 38 from the outside. The conductive layer 32 formed in the circuit element 30 is connected to the conductive layer 12 formed in the plate substrate 10 and the conductive layer 92 formed in the cover member 90 by the bonding wires 64. A through-hole 98 is made in the cover member 90 while piercing the cover member 90 in the thickness direction. The through-hole 98 partially constitutes the acoustic port.

The top-port type microphone 1 is constructed by the above configuration. The top-port type microphone 1 includes the external connection terminal 14, and the acoustic port is provided at the position distant from the plate substrate 10 mounted on the mother substrate. In the microphone 1 of the fifteenth embodiment, similarly to the first embodiment, the acoustic port through which the acoustic vibration is introduced to the cavity 28 is formed into the bent shape. The acoustic port having the bent shape is formed by the through-hole 98 and the hollow region 48. Therefore, the breakage of the diaphragm 24 can be reduced because a foreign matter or compressed air is restrained from invading into the cavity 28 through the acoustic port and reaching the diaphragm 24. Additionally, the volume of the back chamber is increased by reducing the dimension in the height direction of the microphone 1, so that the performance of the microphone 1 can be improved.

In one or more of the above embodiments, by way of example, the projection image formed by projecting the sensor substrate 20 on the main surface of the base substrate along the thickness direction of the base substrate is wholly overlapped by the opening of the through-hole made in the main surface of the base substrate. Alternatively, the projection image of the sensor substrate 20 may be partially overlapped by the opening. When the through-hole partially overlaps the sensor substrate 20, the effect to restrain the foreign matter from invading into the cavity 28 can similarly be obtained.

In one or more of the above embodiments, by way of example, the bonding wires 62 and 64 are used to electrically connect the acoustic sensor, the circuit element 30, and the substrate on which the acoustic sensor is mounted. However, the electric connection is not limited to the wire bonding. For example, the planar circuit element 30 and the planar acoustic sensor may electrically be connected to each other by flip-chip bonding, or the circuit element 30 and the acoustic sensor may electrically be connected to each other using a through silicon via (TSV) piercing the circuit element 30.

The microphone 1 may further include a conductive electromagnetic shield in order to reduce an electromagnetic noise. The electromagnetic shield may be disposed on the surface on the side opposite to the surface opposed to the acoustic sensor in the surfaces of the circuit element 30 stacked on the acoustic sensor. Alternatively, the electromagnetic shield may be disposed on at least one of both the outer surface and the inner surface of the housing of the microphone 1.

The disclosed embodiments of the present invention are not restrictive, but illustrative in all respects. The scope of the present invention is indicated by not the above description but claims, and the meaning equivalent to the claims and all the changes within the claims are included in the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A microphone comprising:
    a base substrate comprising a main surface;
    an acoustic sensor mounted on the main surface; and
    a circuit element that processes a signal output from the acoustic sensor,
    wherein the acoustic sensor comprises:
        a sensor substrate comprising:
        a first surface opposed to the base substrate,
        a second surface on a side opposite to the first surface, and
        a cavity formed while piercing the sensor substrate from the first surface to the second surface, and
        a movable electrode that covers the cavity from the second surface side,
    wherein four slit-shaped through-holes are formed in the base substrate while piercing the base substrate in a thickness direction to communicate with the cavity, wherein the through-holes overlap the sensor substrate when viewed in the thickness direction of the base substrate, wherein an adhesive layer interposed between the main surface and the first surface to cause the sensor substrate to adhere to the base substrate, and wherein an interposition member is interposed between the main surface and the first surface while piercing the adhesive layer.

2. The microphone according to claim 1, wherein a hollow region where the adhesive layer is not provided is formed between the main surface and the first surface, and wherein the through-holes communicate with the cavity through the hollow region.

3. The microphone according to claim 1, wherein a recess in which at least one of the main surface and the first surface is recessed is formed, and wherein the through-holes communicate with the cavity through the recess.

4. The microphone according to claim 1, wherein the base substrate comprises a projection projected from the main surface, and wherein the sensor substrate is mounted on the projection.

5. The microphone according to claim 1, wherein each of the through-holes is made along a peripheral edge of the cavity in the first surface.

6. The microphone according to claim 1, wherein the circuit element is stacked on the acoustic sensor.

7. The microphone according to claim 1, wherein the four slit-shaped through-holes partially surround a central portion of the main substrate on four sides.

8. The microphone according to claim 2, wherein a recess in which at least one of the main surface and the first surface is recessed is formed, and wherein the through-holes communicate with the cavity through the recess.

9. The microphone according to claim 2, wherein the base substrate comprises a projection projected from the main surface, and wherein the sensor substrate is mounted on the projection.

10. The microphone according to claim 2, wherein each of the through-holes is made along a peripheral edge of the cavity in the first surface.

11. The microphone according to claim 3, wherein an adhesive cured material in which a liquid adhesive is cured is accommodated in part of the recess.

12. The microphone according to claim 3, wherein the base substrate comprises a projection projected from the main surface, and wherein the sensor substrate is mounted on the projection.

13. The microphone according to claim 3, wherein each of the through-holes is made along a peripheral edge of the cavity in the first surface.

14. The microphone according to claim 4, wherein the projection is projected from the main surface along a peripheral edge of the through-holes in the main surface.

15. The microphone according to claim 4, wherein each of the through-holes is made along a peripheral edge of the cavity in the first surface.

16. The microphone according to claim 11, wherein the base substrate comprises a projection projected from the main surface, and wherein the sensor substrate is mounted on the projection.

17. The microphone according to claim 11, wherein each of the through-holes is made along a peripheral edge of the cavity in the first surface.

18. The microphone according to claim 14, wherein each of the through-holes is made along a peripheral edge of the cavity in the first surface.

* * * * *